United States Patent [19]
Morosas

[11] Patent Number: 5,581,442
[45] Date of Patent: Dec. 3, 1996

[54] SPRING CLIP FOR CLAMPING A HEAT SINK MODULE TO AN ELECTRONIC MODULE

[75] Inventor: Christopher G. Morosas, Sutton, Mass.

[73] Assignee: Wakefield Engineering, Inc., Wakefield, Mass.

[21] Appl. No.: 465,725

[22] Filed: Jun. 6, 1995

[51] Int. Cl.$^6$ .................................................. H05K 7/20
[52] U.S. Cl. .................. 361/704; 165/80.2; 165/80.3; 165/185; 174/16.3; 248/505; 248/510; 257/719; 267/150; 267/160; 361/710; 361/715
[58] Field of Search ................................. 165/80.2, 80.3, 165/185; 174/16.3; 248/228, 316.7, 505, 510; 257/706, 707, 717–719, 726, 727; 267/150, 160; 361/697, 704, 707, 709–711, 715–718, 722; 411/352, 516, 517

[56] References Cited

U.S. PATENT DOCUMENTS

| | | |
|---|---|---|
| 4,509,839 | 4/1985 | Lavochkin ............................ 257/718 |
| 4,716,494 | 12/1987 | Bright et al. ......................... 174/16.3 |
| 5,208,731 | 5/1993 | Blomquist . |
| 5,251,101 | 10/1993 | Liu . |
| 5,276,585 | 1/1994 | Smithers . |
| 5,323,845 | 6/1994 | Kin-Shon . |
| 5,381,305 | 1/1995 | Harmon et al. . |
| 5,475,564 | 12/1995 | Chiou .................................... 361/704 |

FOREIGN PATENT DOCUMENTS 0558359  9/1993  European Pat. Off. ............... 361/709

*Primary Examiner*—Gregory D. Thompson
*Attorney, Agent, or Firm*—Blodgett & Blodgett, P.C.

[57] ABSTRACT

A spring clip for clamping a heat sink module to an electronic module which has a pair of opposite side edge surfaces and a pair of spaced projections which extend from each side edge surface. The spring clip includes an elongated generally horizontal middle segment, a pair of end segments at opposite ends of the middle segment which extend in a first direction at an upward angle and a finger tab segment which is connected to the middle segment and which extends at an upward angle in a second direction which is opposite the first direction. A spring clip and heat sink assembly is formed by attaching a pair of spring clips to opposite ends of the heat sink for application to an electronic module. A heat dissipating assembly is formed by applying the spring clip and heat sink assembly to an electronic module which has a pair of projections extending from opposite edge surfaces of the electronic module. The horizontal middle segment of the spring clip can be moved from an inactive state above a respected pair of projections to an active state beneath the projections so that the middle segment is biased upwardly against the projections for clamping the heat sink to the electronic component.

12 Claims, 4 Drawing Sheets

SPRING CLIP FOR CLAMPING A HEAT SINK MODULE TO AN ELECTRONIC MODULE

BACKGROUND OF THE INVENTION

The present invention is directed to a heat dissipating assembly, a spring clip and heat assembly, and to a spring clip for clamping a heat sink module to an electronic module.

A standard electronic module includes a microprocessor chip module which is connected to a socket module which is, in turn, fixed to a pc board. A typical heat sink includes a flat base and a plurality of spaced cooling fins which extend upwardly from the base.

A wide variety of spring clips have been developed for clamping a heat sink to an electronic module. In many cases, a single clip is utilized to clamp a heat sink to two opposite ends of an electronic module. The clip is thereby limited to application to a heat sink and electronic module of a specific size. Also, the spring clip is difficult to apply and to remove from the heat sink and electronic module package. In many cases, special tools are required for application of the spring clip. Excess manipulation of the electronic module and heat sink can result in damage to or shorting out of the delicate terminal leads of the electronic module. Another problem which is frequently encountered with prior art clips is that they frequently become loose from their clamping function due to vibrations and other conditions which are normally encountered during operation of the electronic apparatus to which the heat dissipating electronic assembly is applied.

These and other difficulties experienced with the prior art spring clips and heat dissipating assemblies have been obviated by the present invention.

it is, therefore, a principal objection of the present invention to provide a spring clip for application to one end of a heat sink module for clamping one end of the heat sink module to one end of an electronic module, the opposite end of the heat sink module being clamped to the opposite end of the electronic module.

Another object of the present invention is the provision of spring clip and heat sink. assembly which includes a pair of spring clips which are connected to opposite ends of the heat sink for application to an electronic module which has a pair of projections at opposite ends of the electronic module so that a portion of each clip overlies a respective pair of projections and so that the respective pair of projections are engaged in a clamping mode upon the application of a alternatively small biasing force on the clip toward the projections.

A further object of the present invention is the provision of a spring clip which can be applied to and removed from a heat sink module relatively quickly and easily.

It is another object of the present invention to provide a spring clip and heat sink assembly which can be applied to and removed from an electronic module relatively quickly and easily.

A still further object of the invention is to provide a spring clip for clamping a heat sink to an electronic module in which the heat sink is simple in construction and relatively easy to manufacture.

It is a further object of the invention to provide a heat dissipating assembly which is easy to assemble and which remains securely assembled during normal use in an electronic device.

With these and other objects in view, as will be apparent to those skilled in the art, the invention resides in the combination of parts set forth in the specification and covered by the claims appended hereto.

SUMMARY OF THE INVENTION

The invention consists of a spring clip clamping a heat sink module to an electronic module which has a pair of opposite side edge surfaces and a pair of spaced projections which extend from each side edge surface. The spring clip includes an elongated generally horizontal middle segment, a pair of end segments at opposite ends of the middle segment which extend in a first direction at an upward angle and a finger tab segment which is connected to the middle segment and which extends at an upward angle in a second direction which is opposite the first direction. The invention also consists of a spring clip and heat sink assembly in which a spring clip is attached to opposite ends of the heat sink for application to an electronic module so that the middle segment of each spring clip lies above a respective pair of spaced projections. The middle segment is adapted to be moved to a position below the projections upon application of downward pressure on the finger tab segment for clamping the heat sink to the electronic module. The invention also consists of a heat dissipating assembly which includes an electronic module which has a pair of projections extending from opposite edge surfaces of the electronic module a heat sink which has a pair of opposite vertical end walls and a pair of spring clips which are connected to the end walls of the heat sink at opposite ends of the heat sink. Each spring clip has a horizontal middle segment which can be moved from an inactive state above a respected pair of projections to an active state beneath the projections so that the middle segment is biased upwardly against the projections for clamping the heat sink to the electronic component.

BRIEF DESCRIPTION OF THE DRAWINGS

The character of the invention, however, may be best understood by reference to one of its structural forms, as illustrated by the accompanying drawings, in which.

DESCRIPTION OF THE PREFERRED EMBODIMENT

Figure 1:
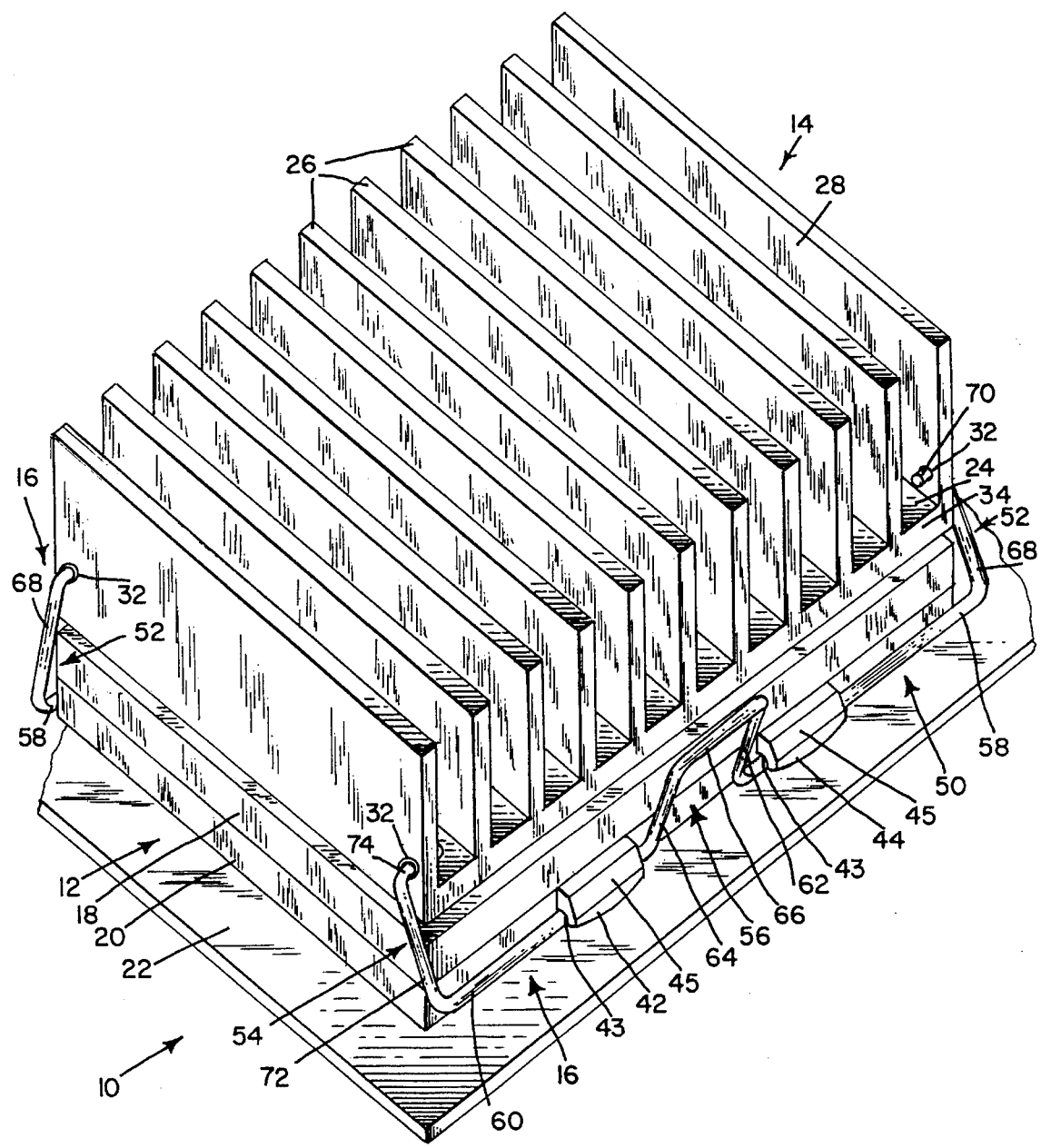
FIG. 1 is an isometric view of a heat dissipating assembly which includes a heat sink module which is clamped to an electronic module by a pair of spring clips of the present invention.
Figure 2:
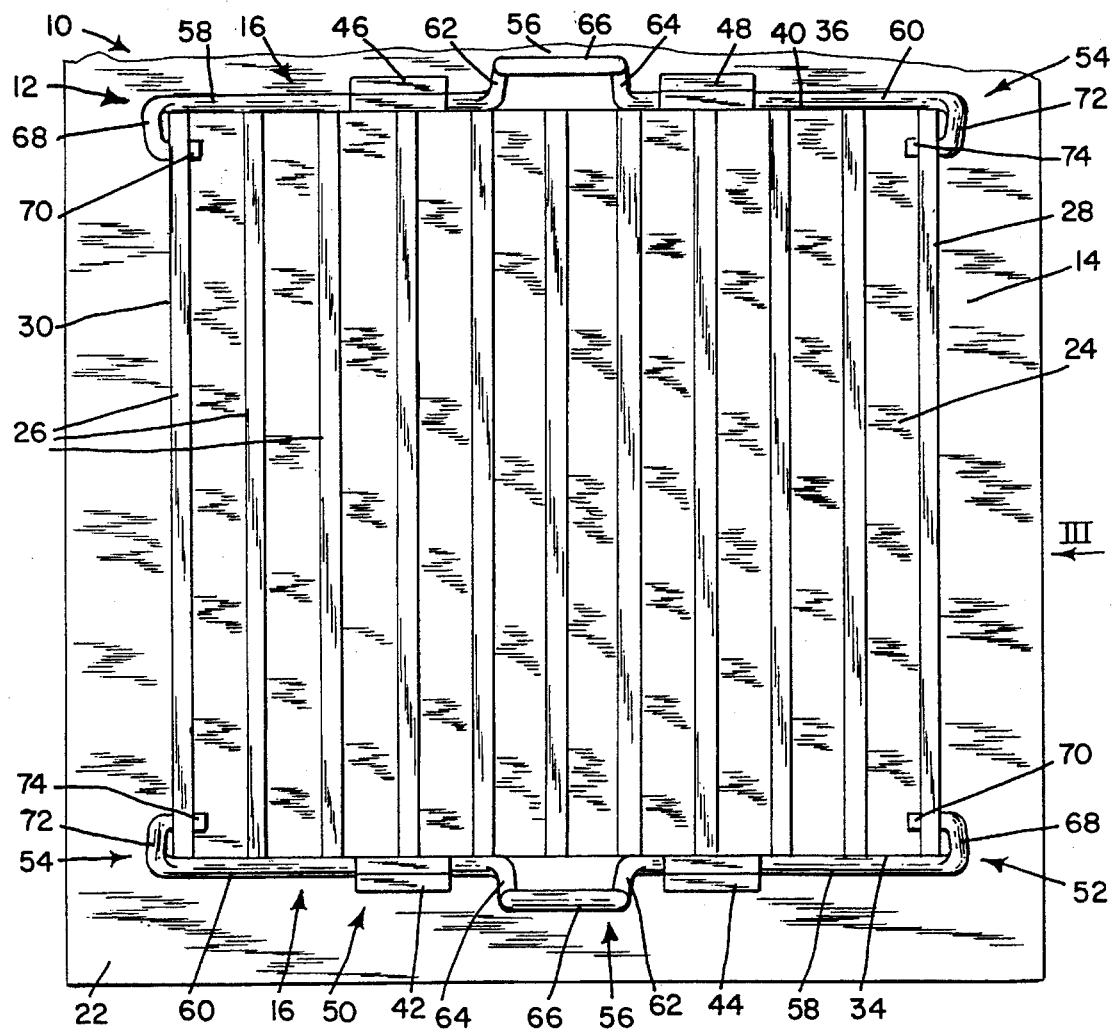
FIG. 2 is a top plan view of the heat dissipating assembly.
Figure 3:
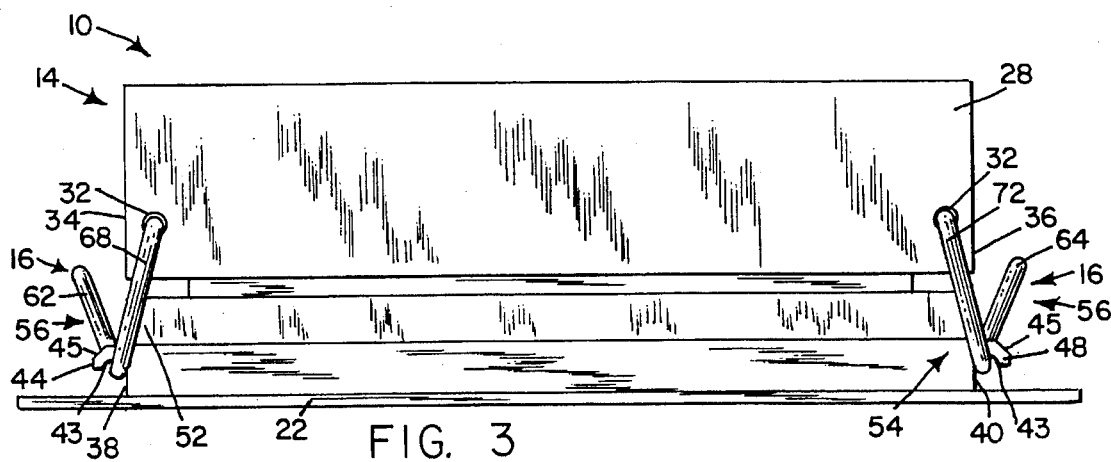
FIG. 3 is a side elevational view of the heat dissipating assembly looking in the direction of arrow III of FIG. 2.
Figure 4:
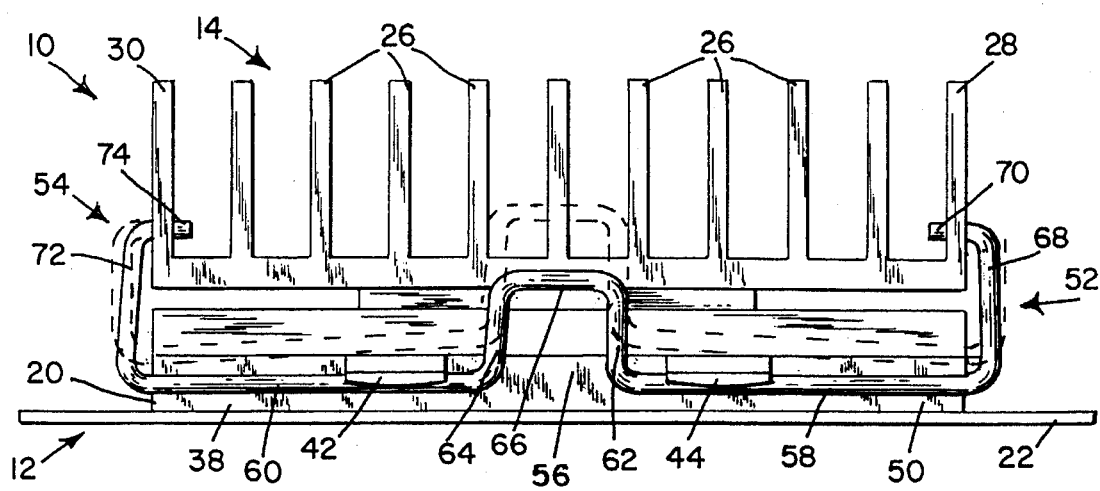
FIG. 4 is a front elevational view of the heat dissipating assembly.

Referring first to FIGS. 1-4, the heat dissipating assembly is generally indicated by the reference numeral 10 and comprises an electronic module which is generally indicated by the reference numeral 12, a heat sink which is generally indicated by the reference numeral 14, and a pair of spring clips which is generally indicated by the reference numeral 16.

The electronic module includes a pc board 22, a socket module 20 which is fixed to the pc board 22, and a microprocessor chip module 18 which is attached to the socket module 20. The socket module 20 has a first vertical side edge surface 38 at one end of the module and a second vertical side edge 40 at the opposite end of the module. A pair of projections 42 and 44 extend horizontally from the edge surface 38. A pair of projections 46 and 48 extend horizontally from the edge surface 36. Each of the projections 42, 44, 46, and 48 has a downwardly facing concave bottom surface 43 and an upwardly and outwardly facing leveled surface 45.

The heat sink 14 comprises a horizontal base 24 and a plurality of parallel spaced heat dissipating fins 26 which, in the example shown FIGS. 1–4, extend vertically from the base 24. The outermost fin 26 at one side end of the heat sink represents a first vertical end wall 28. The outermost fin at the opposite side end of the heat sink represents a second vertical end wall 30. The heat sink 14 has first vertical outer edge surface 34 which extends transversely of the fins 26 from the first end wall 28 to the second end wall 30. A second outer vertical edge surface 36 is located at the opposite end of the heat sink 14 and extends transversely of the fins 26 from the first end wall 28 to the second end wall 30. Each of the end walls 28 and 30 has an aperture 32 at each end of the end wall adjacent the base 24 and one of the first and second outer edge surfaces 34 and 36.

Figure 5:
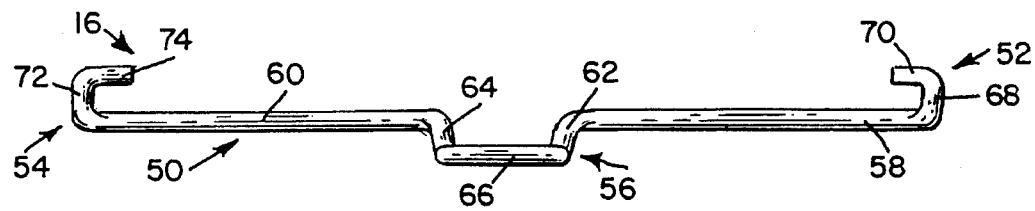
FIG. 5 is a top plan view of the spring clip of the present invention.
Figure 6:
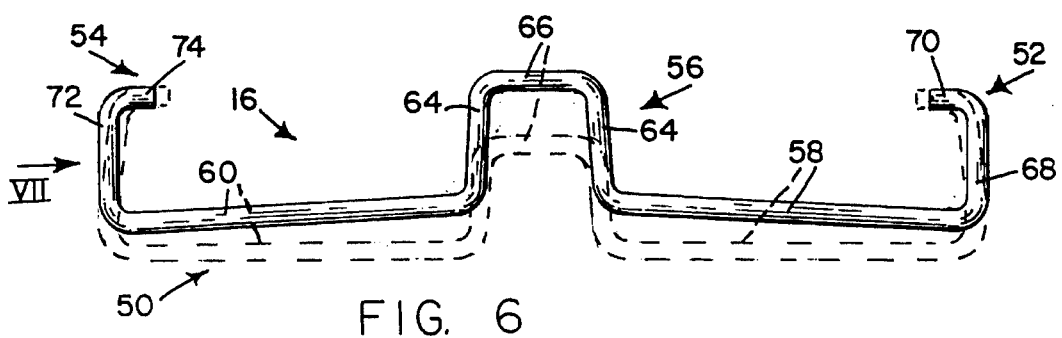
FIG. 6 is a front elevational view of the spring clip of the present invention.
Figure 7:
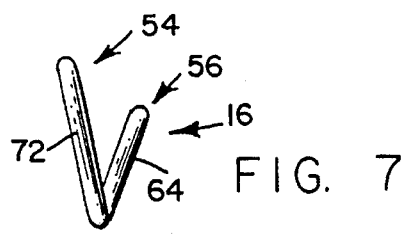
FIG. 7 is an end view of the spring clip of the present invention looking in the direction of arrow VII in FIG. 6.

Referring particularly to FIGS. 5–7, each spring clip 16 comprises a generally horizontal middle segment which is generally indicated by the reference numeral 50, a first end segment which is generally indicated by the reference numeral 52 at one end of the middle segment 50, a second end segment which is generally indicated by the reference numeral 54 at the opposite end of the middle segment 50, and a finger tab segment which is generally indicated by the reference numeral 56. The finger tab segment 56 is located intermediate the end segments 52 and 54. The middle segment 50 comprises a first horizontal portion 58 which extends from the finger tab segment 56 to the first end segment 52 and a second horizontal portion 60 which extends from the finger tab segment 56 to the second end portion 54. The finger tab segment 56 has a first leg portion 62 which is connected to the inner end of the first horizontal portion 58 and a second leg portion 64 which is connected to the second horizontal portion 60. The leg portions 62 and 64 are parallel and extend forwardly and upwardly from the middle segment 50. The first end segment 52 has a rearwardly and upwardly extending portion 68 and a horizontal portion 70 which extends toward the finger tab segment 56 to a free end. The second end segment 54 has a rearwardly and upwardly extending portion 72 which is fixed to the outer end of the second horizontal portion 60 and a horizontal portion 74 which extends toward the finger tab segment 66 to a free end. Each of the horizontal portions 58 and 60 extend upwardly at a slight angle from its respective end segment to the finger tab segment 56.

The spring clip 16 normally assumes an inactive position, as shown in full lines in FIG. 6. The spring clip 16 can assume an active or clamping position, as shown in dotted lines in FIG. 6, by maintaining the horizontal portions 70 and 74 in a fixed vertical position relative to the remainder of the spring clip and applying downward pressure on the finger tab segment 66 which is sufficient to deflect the horizontal portions 58 and 60 so that they assume a substantially horizontal position, as shown in dotted lines in FIG. 6. This also causes the end segments 52 and 54 to deflect inwardly toward each other to their dotted line position, as shown in FIG. 6.

Referring again to FIGS. 1–4, the spring clip and heat sink assembly of the present invention is formed by attaching a spring clip 16 to opposite ends of the heat sink 14. A first spring clip 16 is applied to the heat sink 14 adjacent the first outer edge surface 34 by inserting the horizontal portions 70 and 74 of the spring clip into the adjacent apertures 32 in the first and second vertical end walls 28 and 30. A second spring clip 16 is applied to the opposite end of the heat sink 14 by placing the spring clip adjacent the second outer edge surface 36 and inserting the horizontal portion 70 and 74 into the adjacent apertures 32 at the opposite ends of the first and second vertical end walls 28 and 30, respectively. The spring clips 16 are thereby held captive in the heat sink 14 so that the spring clip and heat sink. assembly form thereby is ready to be applied to an electronic module such as the electronic module 12.

The spring clip and heat sink assembly is applied to the electronic module 21 by placing the base 24 of the heat sink on the upper surface of the electronic module so that the first vertical outer edge surface 34 of the heat sink is vertically aligned with the first side edge surface 38 of a socket module 20 and the second vertical outer edge surface 36 of the heat sink is vertically aligned with the second side edge surface 40 of the socket module 20. When the spring clip and heat sink assembly of the present invention is positioned on top of the microprocessor chip module 18, as shown in FIGS. 1–4, the spring clips 16 are in their inactive state so that the middle segments 50 of the spring clips lie above the projections 42, 44, 46 and 48, as illustrated by the dotted lines in FIG. 4. Each spring clip 16 is rendered to its active or clamping position by applying downward pressure on the finger tab segment 56 so that the horizontal portions 58 and 60 move outwardly and downwardly along the beveled surfaces 45 of the adjacent projections of the socket module 20 and inwardly under the concave bottom surfaces 43 of the projections. Upon release of downward pressure on the finger tab segment 56 the horizontal portions 58 and 60 are biased upwardly against the concave bottom surfaces 43 due to the springiness of resiliency of the spring clip. This causes the heat sink 14 to be firmly and securely clamped against the upper surface of the microprocessor chip module 18 to form the heat dissipating assembly 10 of the present invention.

The heat sink and spring clip assembly can be disengaged by the electronic module 12 by applying downward pressure to the finger tab segment 16 so that the horizontal portions 58 and 60 are moved downwardly and outwardly from the concave bottom surfaces of their respective projections. A gradual release of downward pressure on the finger tab segments 56 enables the horizontal portions 58 and 60 to move upwardly along the beveled surfaces 45 of the projections until the spring clip reaches its inactive position, as shown by the dotted lines in FIG. 4. At this point, the heat sink and spring clip assembly can be removed from the electronic module 12.

MODIFIED HEAT DISSIPATION ASSEMBLY

Figure 8:
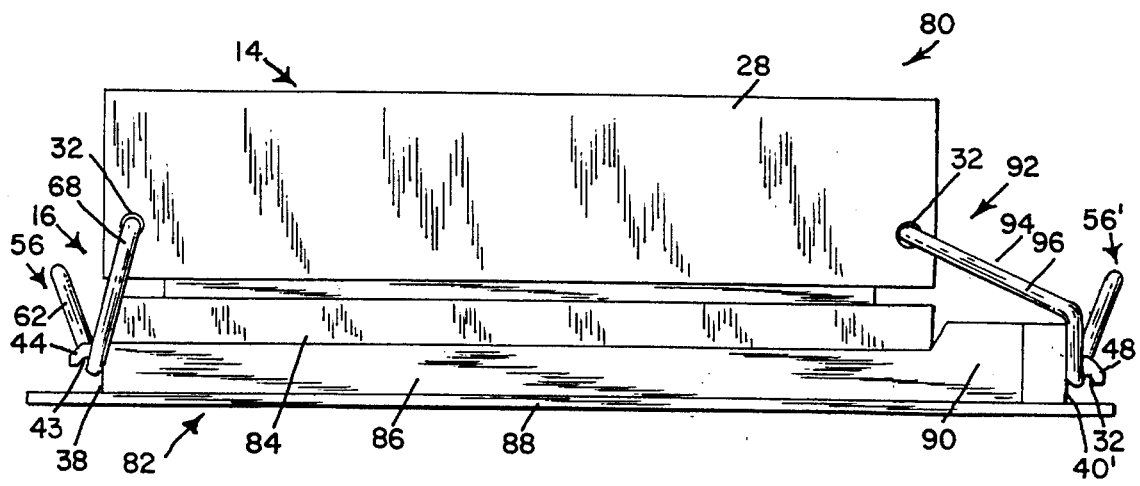
FIG. 8 is a side elevational view of a modified spring clip of the present invention shown applied to an electronic module which has a different configuration than the electronic module which is shown in FIGS. 1-4.

Referring to FIG. 8, there is shown a modified heat dissipating assembly which is generally indicated by the reference numeral 80. The heat dissipating assembly includes an electronic module, generally indicated by the reference numeral 82, the heat sink 14, the spring clip 16 at one end of the heat dissipating assembly, and a modified spring clip 92 at the opposite end of the modified heat sink assembly.

The electronic module 82 includes a microprocessor chip module 84, a socket module 86, and a pc board 88. The socket module 86 differs from the socket module 20 in that it has an extending portion 90 at one end of the module, the extending portion 90 has a first vertical side edge surface 40' which is identical to the side edge surface 40 of the socket module 20 and which includes the projections 46 and 48. The opposite end of the socket module 86 is identical to that of the socket module 20 and includes the first side edge surface 38 which has the first pair of projections 42 and 44 for engaging the spring clip 16. The middle and finger tab segments of the modified spring clip 92 are identical to those of the spring clip 16, the finger tab segment being indicated by the reference numeral 56' in FIG. 8. The modified spring clip 92 has an end segment 94 at each end of the spring. Each end segment of the clip 92 has the same general shape as the end segments 68 and 72 except that it has a substantially longer rearwardly extending portion 96 for accommodating the greater distance between the corresponding projection on the extending portion 90 and the corresponding aperture 32 of the heat sink, as shown in FIG. 8. The spring clip 92 is applied to and removed from the projections of the socket module 86 in the same manner as described for the spring clip 16.

Clearly, minor changes may be made in the form and construction of this invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. A spring clip and heat sink assembly for clamping to an electronic module which has a first side edge surface, a first pair of projections which extend horizontally from said first side edge surface, a second side edge surface which is opposite said first side edge surface, and a second pair of projections which extend horizontally from said second side edge surface, said spring clip and heat sink assembly comprising:

(a) a heat sink comprising:
      (1) a first vertical end wall at one end of said heat sink, said first vertical end wall having a first end and a second end;
      (2) a second vertical end wall which is at another end of the heat sink which is opposite said one end, said second vertical end wall having a first end and a second end;
      (3) a first outer edge surface which extends from the first end of said first vertical end wall to the first end of said second end wall at a right angle to said first and second vertical end walls; and
      (4) a second outer edge surface which extends from the second end of said first vertical end wall to the second end of said second end wall at a right angle to said first and second vertical end walls;

(b) a first spring clip comprising:
      (1) a first generally horizontal middle segment which is parallel with and outside of said first outer vertical edge surface, said first middle segment having a first end and a second end which is opposite said first end;
      (2) a first end segment which is pivotally connected to the first end of said first vertical end wall and is fixed to the first end of said first middle segment;
      (4) a second end segment which is pivotally connected to the first end of said second vertical end wall and is fixed to the second end of said first middle segment, and
      (5) a first finger tab segment which is fixed to said first middle segment so that when said heat sink is placed on an electronic module so that said first middle segment is above said first pair of projections, downward pressure on said finger tab portion enables said first middle segment to be moved outside of and then beneath said first projections and release of downward pressure on said finger tab segment enables said first middle segment to be biased upwardly against said first projections to clamp the heat sink module to the electronic module;

(c) a second spring clip comprising:
      (1) a second generally horizontal middle segment which is parallel with and outside of said first outer vertical edge surface, said second middle segment having a first end and a second end;
      (2) a first end segment which is pivotally connected to the second end of said first vertical end wall and is fixed to the first end of second middle segment;
      (3) a second end segment which is pivotally connected to the second end of said second vertical end wall and is fixed to the second end of said second middle segment, and
      (4) a second finger tab segment which is fixed to said second middle segment so that when said heat sink is placed on an electronic module so that said second middle segment is above said second pair of projections, downward pressure on said second finger tab segment enables said second middle segment to be moved outside of and then beneath said second projections and release of downward pressure on said second finger tab segment enables said second middle to be biased upwardly against said second projections to clamp the heat sink module to the electronic module.

2. A spring clip and heat sink assembly as recited in claim 1, wherein each of said first and second middle segments has a first horizontal portion which is connected to its respective first end segment and a second horizontal portion which is connected to its respective second end segment, and wherein each of said first and second finger tab segments is located between its respective first and second horizontal portions and is connected to each of its respective first and second horizontal portions.

3. A spring clip and heat sink assembly as recited in claim 2, wherein each of said first and second finger tab segments has an inverted U-shape and comprises a first leg portion which is connected to its respective first horizontal portion and which extends upwardly from its respective first horizontal portion to an upper end, a second leg portion which is connected to its respective second horizontal portion and which extends upwardly from its respective second horizontal portion to an upper end, and a horizontal connecting portion which connects the upper ends of its respective first and second leg portions.

4. A heat dissipating assembly as recited in claim 2, wherein each of said first and second spring clips has an inactive state in which each of its respective first and second horizontal portions extends at a relatively small upward angle to the horizontal from its respective end segment to its respective finger tab segment to an active state in which each of its respective first and second horizontal portions is substantially horizontal.

5. A spring clip and heat sink assembly as recited in claim 1, wherein each of the first and second vertical end walls of said heat sink has an aperture at its first and second end, and wherein each of the first and second end segments of each of said first and second spring clips comprises a portion which extends upwardly and toward the heat sink at a right angle from its respective substantially horizontal middle segment and a horizontal portion which extends into one of said apertures toward the other of said end segments to a end.

6. A spring clip and heat sink assembly as recited in claim 1, wherein of said first and second spring clip is a continuous length of spring wire.

7. A heat dissipating assembly comprising:
   (a) an electronic module which has a first side edge surface, a first pair of projections which extend horizontally from said first side edge surface, a second side edge surface which is opposite said first side edge surface, and a second pair of projections which extend horizontally from said second side edge surface;
   (b) a heat sink comprising:
      (1) a first vertical end wall at a first end of said heat sink, said first vertical end wall having a first end and a second end;
      (2) a second vertical end wall at a second end of the heat sink which is opposite said first end, said second vertical end wall having a first end and a second end;
      (3) a first outer edge surface which extends from the first end of said first vertical end wall to the first end of said second end wall at a right angle to said first and second vertical end walls and parallel with and adjacent the first side edge surface of said electronic module; and
      (4) a second outer edge surface which extends from the second end of said first vertical end wall to the second end of said second end wall at a right angle to said first and second vertical end walls and parallel with the second side edge surface of said electronic module;
   (c) a first spring clip comprising:
      (1) a first generally horizontal middle segment which is parallel with and outside of said first outer vertical edge surface, said horizontal middle segment having a first end and a second end which is opposite said first end;
      (2) a first end segment which is pivotally connected to the first end of said first vertical end wall and is fixed to the first end of said middle segment;
      (3) a second end segment which is pivotally connected to the first end of said second vertical end wall and is fixed to the second end of said middle segment, and
      (4) a first finger tab segment which is fixed to said first middle segment, said first spring clip having an inactive state wherein said first middle segment rests on said first pair of projections and an active state wherein said second middle segment is beneath said first pair of projections and is biased upwardly against said first pair of projections, said first spring clip being moved from said inactive state to said active state by the application of downward pressure on said first finger tab segment to move said first middle segment outside of and then beneath said first projections, said first middle segment being biased upwardly against said first projections to clamp the heat sink module to the electronic module upon the release of downward pressure on said finger tab segment;
   (d) a second spring clip comprising:
      (1) a second generally horizontal middle segment which is parallel with and outside of said first outer vertical edge surface, said second middle segment having a first end and a second end;
      (2) a first end segment which is pivotally connected to the second end of said first vertical end wall and is fixed to the first end of said second middle segment;
      (3) a second end segment which is pivotally connected to the second end of said second vertical end wall and is fixed to the second end of its said second middle segment, and
      (4) a second finger tab segment which is fixed to said second middle segment, said second spring clip having an inactive state wherein said second middle segment rests on said first pair of projections and an active state wherein second middle segment is beneath said first pair of projections and is biased upwardly against said first pair of projections, said first spring clip being moved from said inactive state to said active state by the application of downward pressure on said second finger tab segment to move said second middle segment outside of and then beneath said first projections said second middle segment being biased upwardly against said first projections to clamp the heat sink module to the electronic module upon the release of downward pressure on said finger tab portion.

8. A heat dissipating assembly as recited in claim 7, wherein each of said first and second said middle segments has a first horizontal portion which is connected to its respective first end segment and a second horizontal portion which is connected to its respective second end segment, and wherein each of said first and second finger tab segments is located between its respective first and second horizontal portions and is connected to each of its respective first and second horizontal portions.

9. A heat dissipating assembly as recited in claim 8, wherein each of said first and second finger tab segments has an inverted U-shape and comprises a first leg portion which is connected to its respective first horizontal portion and which extends upwardly from its respective first horizontal portion to an upper end, a second leg portion which is connected its respective said second horizontal portion and which extends upwardly from its respective second horizontal portion to an upper end, and a horizontal connecting portion which connects the upper ends of said first and second leg portions.

10. A heat dissipating assembly as recited in claim 8, wherein each of said first and second spring clips has an inactive state in which each of its respective first and second horizontal portions extend at a relatively small upward angle to the horizontal from its respective end segment to its respective finger tab segment, and an active state in which each of its respective first and second horizontal portions is substantially horizontal.

11. A heat dissipating assembly as recited in claim 7, wherein each of said first and second end segments of each of said first and second spring clips comprises a portion which extends upwardly and toward said first direction at a right angle from said horizontal middle segment and a horizontal portion which extends toward the other of its respective end segment to a free end.

12. A heat dissipating assembly as recited in claim 7, wherein said clip is a continuous length of spring wire.

* * * * *